(12) United States Patent
Kihara et al.

(10) Patent No.: US 8,586,174 B2
(45) Date of Patent: *Nov. 19, 2013

(54) LAMINATE AND PROCESS FOR ITS PRODUCTION

(71) Applicant: Asahi Glass Company, Limited, Chiyoda-ku (JP)

(72) Inventors: Naoto Kihara, Chiyoda-ku (JP); Takuya Nakao, Chiyoda-ku (JP); Hiroshi Aruga, Chiyoda-ku (JP); Eiji Shidoji, Chiyoda-ku (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/756,970

(22) Filed: Feb. 1, 2013

(65) Prior Publication Data

US 2013/0149516 A1    Jun. 13, 2013

Related U.S. Application Data

(63) Continuation of application No. 13/559,746, filed on Jul. 27, 2012, now Pat. No. 8,435,633, which is a continuation of application No. PCT/JP2011/054808, filed on Mar. 2, 2011.

(30) Foreign Application Priority Data

Mar. 12, 2010   (JP) .................................. 2010-056224

(51) Int. Cl.
  *B32B 18/00*    (2006.01)
  *B32B 27/06*    (2006.01)
  *B32B 27/28*    (2006.01)

(52) U.S. Cl.
  USPC ........... 428/215; 428/336; 428/421; 428/698; 428/702

(58) Field of Classification Search
  None
  See application file for complete search history.

(56) References Cited

U.S. PATENT DOCUMENTS

| 5,312,685 A | 5/1994 | Banks et al. |
| 2002/0050287 A1 | 5/2002 | Yamada et al. |
| 2012/0315488 A1 | 12/2012 | Shidoji et al. |

FOREIGN PATENT DOCUMENTS

| JP | 2000-103888 | 4/2000 |
| JP | 2000-138387 | 5/2000 |
| JP | 2000-208795 | 7/2000 |
| JP | 2009-158778 | 7/2009 |
| JP | 2010-16286 | 1/2010 |

OTHER PUBLICATIONS

International Search Report issued May 31, 2011 in PCT/JP2011/054808, filed Mar. 2, 2011.

*Primary Examiner* — Ramsey Zacharia
(74) *Attorney, Agent, or Firm* — Oblon, Spivak, McClelland, Maier & Neustadt, L.L.P.

(57) ABSTRACT

To provide a laminate excellent in weather resistance, moisture-proof property, adhesion between layers and its long-term stability, and a process for its production. A laminate comprising a substrate sheet containing a fluororesin, an adhesive layer, and a moisture-proof layer containing, as the main component, at least one inorganic compound selected from the group consisting of an inorganic oxide, an inorganic nitride and an inorganic oxynitride, laminated in this order, wherein the adhesive layer contains, as the main component, at least one metal oxide selected from the group consisting of zirconium oxide, tantalum oxide and hafnium oxide.

8 Claims, No Drawings

LAMINATE AND PROCESS FOR ITS PRODUCTION

This application is a continuation of Ser. No. 13/559,746 (filed Jul, 27, 2012 and issued on May 7, 2013 as U.S. Pat. No. 8,435,633) which is a continuation of PCT/JP2011/054808 (filed Mar. 2, 2011) and which claims priority to JP 2010-056224 (filed Mar. 12, 2010).

TECHNICAL FIELD

The present invention relates to a laminate useful as a protective sheet for a solar cell module, and a process for its production.

BACKGROUND ART

In recent years, from the viewpoint of the protection of the global environment, clean energy with higher safety, has been desired. Among clean energies which are expected in the future, particularly a solar cell is highly expected in terms of its cleanness, safety and easy operation.

The core to convert the sunlight put in a solar cell to electric energy is a cell. As the cell, one composed of a monocrystal, polycrystal or amorphous silicon type semiconductor is widely used. A plurality of the cells are usually wired in series or parallel, and further, they are protected with various materials for maintaining the function for a long period of time, and used as a solar cell module.

A solar cell module generally has a structure where the side of the cell hit by sunlight is covered with a tempered glass, the rear side is sealed with a back sheet, and a filer made of a thermoplastic resin (particularly an ethylene/vinyl acetate polymer (hereinafter referred to as "EVA")) is filled in the space between the cell and the tempered glass and in the space between the cell and the back sheet, respectively.

Quality assurance of product for about 20 to 30 years is required for a solar cell module. Since the solar cell module is mainly used outside, weather resistance is required for the constituent material. Further, the tempered glass and back sheet have a role to prevent the deterioration caused by the moisture inside the module, and moisture-proof property is also required.

Although the tempered glass is excellent in not only moisture-proof property but also transparency and weather resistance, its plasticity, shock resistance, operability and so on are low. Therefore, the application of a resin sheet, particularly a fluororesin sheet excellent in weather resistance, has been considered, instead of the tempered glass. However, the resin sheet has a problem that moisture-proof property is low as compared with the tempered glass.

To solve the above-mentioned problem, it has been proposed to provide a vapor deposition thin film of an inorganic oxide as a moisture-proof layer, on a resin sheet. For example, Patent Document 1 proposes a protective sheet having a fluororesin sheet and a resin sheet having a vapor deposition thin film of an inorganic oxide, laminated. Further, Patent Document 2 proposes a protective sheet having a vapor deposition thin film of an inorganic oxide provided on one side of a fluororesin sheet provided, and further having a stain resistant layer and/or an ultraviolet absorber layer provided, in order to improve weather resistance.

However, since the moisture-proof layer has poor adhesion to the resin sheet, when a solar cell module is constituted by providing a filler layer so as to be in contacted with the moisture-proof layer, a problem that the moisture-proof layer peels from the resin sheet, may occur. When a space is created between the resin sheet and the filler layer by the peeling, the durability of the solar cell module decreases by the immersion of moisture and the like.

To solve the above-mentioned problem, it has been proposed to provide a layer for improving the adhesion (an adhesive layer) between the resin sheet and the vapor deposition thin film of an inorganic oxide. For example, Patent Document 3 proposes to provide an anchor coat layer containing a complex mixture of an acrylic polyol and/or a polyester polyol and an isocyanate compound, between a fluororesin substrate layer and a vapor deposition thin film layer of an inorganic oxide. Further, Patent Document 4 proposes to provide a primer layer for vapor deposition, made of a resin having an amide ester moiety, which is obtained by reacting a resin containing oxazoline groups with an acrylic resin made of a poly(meth)acrylic acid and/or a copolymer of a poly(meth)acrylic acid and a comonomer, in a specific ratio, between a substrate and a vapor deposition layer made of an inorganic oxide.

PRIOR ART DOCUMENTS

Patent Documents

Patent Document 1: JP-A-2000-138387
Patent Document 2: JP-A-2000-208795
Patent Document 3: JP-A-2009-158778
Patent Document 4: JP-A-2010-16286

DISCLOSURE OF INVENTION

Technical Problem

However, even if the adhesive layer is provided, there is a problem that the long-term stability of the adhesion between the fluororesin sheet and the moisture-proof film is low.

Under these circumstances, it is an object of the present invention to provide a laminate excellent in weather resistance, moisture-proof property, adhesion between layers and its long-term stability, and a process for its production.

Solution to Problem

To solve the above problem, the present invention provides the following.

[1] A laminate comprising a substrate sheet containing a fluororesin, an adhesive layer, and a moisture-proof layer containing, as the main component, at least one inorganic compound selected from the group consisting of an inorganic oxide, an inorganic nitride and an inorganic oxynitride, laminated in this order,
wherein the adhesive layer contains, as the main component, at least one metal oxide selected from the group consisting of zirconium oxide, tantalum oxide and hafnium oxide.

[2] The laminate according to the above [1], wherein the fluororesin is an ethylene/tetrafluoroethylene copolymer.

[3] The laminate according to the above [1] or [2], wherein the moisture-proof layer contains a Si compound or an Al compound as the inorganic compound.

[4] The laminate according to any one of the above [1] to [3], wherein the moisture-proof layer contains aluminum oxide.

[5] The laminate according to any one of the above [1] to [4], which has a visible light transmittance of at least 80%.

[6] A protective sheet for a solar cell module, using the laminate as defined in any one of the above [1] to [5].

[7] A process for producing the laminate as defined in any one of the above [1] to [5], which comprises:

a step of forming the adhesive layer on at least one side of the substrate sheet containing a fluororesin by a dry method, and a step of forming the moisture-proof layer on the adhesive layer by a dry method.

[8] The process according to the above [7], wherein the dry method used for forming the adhesive layer or the moisture-proof layer is a sputtering method or a plasma chemical vapor deposition method.

Advantageous Effects of Invention

According to the present invention, it is possible to provide a laminate excellent in weather resistance, moisture-proof property, adhesion between layers and its long-term stability, and a process for its production.

DESCRIPTION OF EMBODIMENTS

The laminate of the present invention comprises a substrate sheet containing a fluororesin, an adhesive layer, and a moisture-proof layer containing, as the main component, at least one inorganic compound selected from the group consisting of an inorganic oxide, an inorganic nitride and an inorganic oxynitride, laminated in this order.

Now, the present invention will be described in further detail.

<Substrate Sheet>

The fluororesin constituting the substrate sheet is not particularly limited so long as it is a thermoplastic resin containing fluorine atoms in the molecular structure of the resin, and various known fluororesins can be used. Specifically, a tetrafluoroethylene resin, a chlorotrifluoroethylene resin, a vinylidene fluoride resin, a vinyl fluoride resin or a composite of at least 2 of these resins may, for example, be mentioned. Among them, the tetrafluoroethylene resin or the chlorotrifluoroethylene resin is preferred, and the tetrafluoroethylene resin is particularly preferred, from the viewpoint of the excellence in particularly weather resistance, stain resistance and the like.

The tetrafluoroethylene resin may, for example, be specifically polytetrafluoroethylene (PTFE), a tetrafluoroethylene/perfluoro(alkoxyethylene) copolymer (PFA), a tetrafluoroethylene/hexafluoropropylene/perfluoro(alkoxyethylene) copolymer (EPE), a tetrafluoroethylene/hexafluoropropylene copolymer (FEP), a tetrafluoroethylene/ethylene copolymer (ETFE) or an ethylene/trichlorofluoroethylene copolymer (ETCFE).

As a case requires, these resins may further have a small amount of a comonomer component copolymerized respectively.

The comonomer component may be any monomer so long as it is copolymerizable with other monomers constructing each resin (for example, in the case of ETFE, tetrafluoroethylene and ethylene). For example, the following compounds may be mentioned.

A fluorinated ethylene such as $CF_2=CFCl$ or $CF_2=CH_2$; a fluorinated propylene such as $CF_2=CFCF_3$ or $CF_2=CHCF_3$; a $C_{2-10}$ fluorinated alkylethylene having a fluoroalkyl group such as $CH_2=CHC_2F_5$, $CH_2=CHC_4F_9$, $CH_2=CFC_4F_9$ or $CH_2=CF(CF_2)_3H$; a perfluoro(alkyl vinyl ether) such as $CF_2=CFO(CF_2CFXO)_mR^f$ (wherein $R^f$ is a $C_{1-6}$ perfluoroalkyl group, X is a fluorine atom or a trifluoromethyl group, and m is an integer of from 1 to 5); or a vinyl ether having a group capable of being converted to a carboxylic acid group or a sulfonic acid group, such as $CF_2=CFOCF_2CF_2CF_2COOCH_3$ or $CF_2=CFOCF_2CF(CF_3OCF_2CF_2SO_2F)$, may be mentioned.

As the tetrafluoroethylene resin, among them, PFA, FEP, ETFE or ETCFE is preferred, and particularly, ETFE is preferred from the viewpoint of cost, mechanical strength, sputtering film forming property and the like.

ETFE is a copolymer mainly composed of ethylene units and tetrafluoroethylene units. Here, "unit" means a repeating unit constituting a polymer.

In all the units constituting ETFE, the total content of the ethylene units and the tetrafluoroethylene units is preferably at least 90 mol %, more preferably at least 95 mol %, and may be 100 mol %.

In ETFE, the molar ratio of the ethylene units/the tetrafluoroethylene units is preferably from 40/60 to 70/30, more preferably from 40/60 to 60/40.

As a case requires, ETFE may contain a small amount of comonomer component units. As the comonomer component in the comonomer component units, the same one as mentioned above may be mentioned.

In a case where ETFE contains comonomer component units, the content of the comonomer component units in all the units constituting ETFE is preferably from 0.3 to 10 mol %, more preferably from 0.3 to 5 mol %.

As the chlorotrifluoroethylene resin, for example, one obtained by substituting tetrafluoroethylene of the tetrafluoroethylene resin with chlorotrifluoroethylene may be mentioned. Specifically, a chlorotrifluoroethylene homopolymer (CTFE) or an ethylene/chlorotrifluoroethylene copolymer (ECTFE) may, for example, be mentioned.

The fluororesin contained in a substrate sheet may be one type or two or more types.

The substrate sheet may be one made of only a fluororesin, or one made of a mixed resin of a fluororesin and other thermoplastic resin. However, considering the effect of the present invention, it is preferred that the substrate sheet contains a fluororesin as the main component. The proportion of the fluororesin in the substrate sheet is preferably at least 50 mass %, more preferably at least 70 mass %, based on the total mass of the substrate sheet.

Such other thermoplastic resin may, for example, be an acrylic resin, a polyester resin, a polyurethane resin, a nylon resin, a polyethylene resin, a polyimide resin, a polyamide resin, a polyvinyl chloride resin or a polycarbonate resin.

Further, it is possible to apply a resin obtained by mixing e.g. an additive and filler such as pigment, ultraviolet absorber, carbon black, carbon fiber, silicon carbide, glass fiber or mica.

The substrate sheet may be subject to surface treatment on the side where the adhesive layer is to be formed, for the improvement of the adhesion between the substrate sheet and the adhesive layer. Surface treatment is not particularly limited within a range not to impair the effects of the present invention, and it is possible to optionally select among known surface treatment methods. Specifically, plasma treatment or corona discharge treatment may, for example, be mentioned. Among them, plasma treatment is preferred, since it is possible to carry out treatment homogenously on the whole of the surface to be treated of the substrate sheet, the load on the surface of the substrate sheet is small and the influence over the for long-term stability of the adhesion is small, or the like.

The shape and size of the substrate sheet may be optionally decided according to the purpose, and are not particularly limited. For example, in a case where the laminate is used for a protective sheet for a solar cell module, they may be optionally decided according to the shape and size of the solar cell module.

The thickness of the substrate sheet is preferably at least 10 μm, more preferably at least 20 μm from the viewpoint of the strength. The upper limit of the thickness may be decided optionally according to the purpose, and is not limited. For example, in a case where the laminate is used for a protective sheet which is provided on the side of the cell of a solar cell module, where sunlight hits, the thickness is preferably thinner from the viewpoint of the improvement of power generation efficiency by high light transmittance. Specifically, it is preferably at most 200 μm, more preferably at most 60 μm.

<Adhesive Layer>

The adhesive layer contains, as the main component, at least one metal oxide selected from the group consisting of zirconium oxide, tantalum oxide and hafnium oxide. Here, "containing, as the main component" means that the proportion of the metal oxide in the adhesive layer is at least 95 mol %. The proportion of the metal oxide in the adhesive layer is preferably 100 mol %. That is, the adhesive layer is preferably composed of the metal oxide. The adhesive layer is formed on the substrate sheet, whereby it is possible to maintain the adhesion between the moisture-proof layer, to be formed on the adhesive layer and the substrate sheet, for a long period of time. Further, since the adhesive layer is also excellent in transparency, the transparency as the whole of the laminate is good.

The adhesive layer is preferably formed by a dry method. The film formed by the dry method (vapor deposition film) has an uniform film thickness as compared with a film formed by a wet method, and has high adhesion to the substrate sheet.

As the dry method, a physical vapor deposition method (PVD method), a chemical vapor deposition method (CVD method) or the like may be mentioned.

As the PVD method, a vacuum vapor deposition method, a sputtering method or an ion plating method may, for example, be mentioned, and any of them may be used. Among them, particularly the sputtering method is preferred, since as well as it is excellent in productivity and is industrially widely used, it is possible to obtain a film with a uniform thickness, which is very dense and has a high adhesion to the substrate sheet. As the sputtering method, any of a direct-current sputtering method, a high-frequency sputtering method and an alternating-current sputtering method can be used. The direct-current sputtering method or the alternating-current sputtering method is preferred, since it is excellent in productivity e.g. it is possible to efficiently form a film with a high film forming rate on a substrate having a large area.

As the CVD method, a plasma CVD method, a thermal CVD method or a catalyst CVD method may, for example, be mentioned, and any of them can be used. Among them, the plasma CVD method is preferred, since as well as it is excellent in productivity and is industrially widely used, it is possible to obtain a film with a uniform thickness, which is very dense and has a high adhesion to the substrate sheet.

The specific forming conditions of the adhesive layer can be determined optionally according to the methods and materials to be used.

For example, a zirconium oxide film is obtained by forming by a sputtering method in an oxygen-containing atmosphere by using a zirconium target. In this case, by a method of applying intermittent negative direct-current voltage to the target, it is possible to suppress the arcing during film forming effectively, increase input power, and maintain a further high film forming rate for a long period of time. The specific sputtering conditions may be selected optionally, since the conditions vary depending on various conditions such as an apparatus type and the target composition. Generally, it is preferred to carry out the sputtering under the conditions where after evacuation to from $1\times10^{-4}$ Pa to $8\times10^{-4}$ Pa, argon and oxygen are introduced into a reactor in a flow rate of 0:100 to 90:10, with a sputtering gas pressure of from 0.2 to 3 Pa at a power density of from 0.5 to 5 W/cm$^2$.

A tantalum oxide film or a hafnium oxide film can be formed in the same manner as in the above step except that a tantalum target or a hafnium target is used instead of a zirconium target.

The adhesive layer may be one made of a single layer or one made of multiple layers differing in the type of the metal oxide.

The film thickness of the adhesive layer (when it is made of multiple layers, the thickness is the total thickness) is preferably at least 0.5 nm with a view to securing adhesion to the substrate sheet. Further, it is preferably at most 20 nm, particularly preferably at most 10 nm, with a view to maintaining light transmittance, maintaining flexibility of the substrate sheet and securing adhesion to the substrate sheet.

<Moisture-Proof Layer>

The moisture-proof layer contains, as the main component, at least one inorganic compound selected from the group consisting of an inorganic oxide, an inorganic nitride and an inorganic oxynitride.

Here, "containing, as the main component" means that the proportion of the inorganic compound in the moisture-proof layer is at least 95 mol %. The proportion of the inorganic compound in the moisture-proof layer is preferably 100 mol %. That is, the moisture-proof layer is preferably one composed of the inorganic compound, or one containing the inorganic compound.

The inorganic oxide may, for example, be a meal oxide. As the metal in the metal oxide, aluminum, silicon or magnesium may, for example, be mentioned. As the oxide, particularly silicon oxide ($SiO_x$, $0<x\leq2$) or aluminum oxide ($AlO_x$, $0<x\leq1.5$) is preferred.

As the inorganic nitride, silicon nitride ($SiN_x$, $0<x\leq1.3$) or aluminum nitride ($AlN_x$, $0<x\leq1$) may, for example, be mentioned.

As the inorganic oxynitride, silicon oxynitride ($SiO_xN_y$, $0<x<1$, $0<y<1$) may, for example, be mentioned.

As the inorganic compound, a Si compound or an Al compound is preferred, since it is excellent in transparency, water vapor barrier property and the like. Particularly, as the Si compound, preferred is at least one member selected from the group consisting of $SiO_x$ ($0<x\leq2$), $SiN_x$ ($0<x\leq1.3$) and $SiO_xN_y$ ($0<x<1$, $0<y<1$), and as the Al compound, $AlO_x$ ($0<x\leq1.5$) is preferred.

The moisture-proof layer may be formed by a dry method or a wet method, however, the dry method is preferred. The film formed by the dry method (vapor deposition film) has a uniform thickness as compared with a film formed by the wet method, and has high adhesion to the adhesive layer.

As the dry method, a physical vapor deposition method (PVD method), a chemical vapor deposition method (CVD method) or the like may be mentioned.

As the PVD method, a vacuum vapor deposition method, a sputtering method or an ion plating method may, for example, be mentioned, and any of them may be used. Among them, particularly the sputtering method is preferred, since as well as it is excellent in productivity and is industrially widely used, it is possible to obtain a film with a uniform thickness, which is very dense and has a high adhesion to the adhesive layer. As the sputtering method, any of a direct-current sputtering method, a high-frequency sputtering method and an alternating-current sputtering method can be used. The direct-current sputtering method or the alternating-current sputtering method is preferred, since it is excellent in productivity, e.g. it is possible to efficiently form a film with a high film forming rate on a substrate having a large area.

As the CVD method, a plasma CVD method, a thermal CVD method or a catalyst CVD method may, for example, be mentioned, and any of them can be used. Among them, the plasma CVD method is preferred, since as well as it is excellent in productivity and is industrially widely used, it is possible to obtain a film with a uniform thickness, which is very dense and has a high adhesion to the substrate sheet.

The specific forming condition of the moisture-proof layer can be determined optionally according to the methods and materials to be used.

For example, an aluminum oxide film is obtained by forming by a sputtering method in an oxygen-containing atmosphere by using an aluminum target. In this case, by a method of applying intermittent negative direct-current voltage to the target, it is possible to suppress the arcing during film forming effectively, increase input power, and maintain a further high film forming rate for a long period of time. The specific sputtering conditions may be selected optionally, since the conditions vary depending on various conditions such as an apparatus type target composition. Generally, it is preferred to carry out the sputtering under the conditions where after evacuation to from $1 \times 10^{-4}$ Pa to $8 \times 10^{-4}$ Pa, argon and oxygen are introduced into a reactor in a flow rate of 0:100 to 90:10, with a sputtering gas pressure of from 0.2 to 3 Pa and with a power density of from 0.5 to 5 W/cm$^2$.

The moisture-proof layer may be one made of a single layer or one made of multiple layers differing in the material (for example, an inorganic compound as the main component).

The film thickness of the moisture-proof layer (when it is made of multiple layers, the thickness is the total thickness) is preferably at least 10 nm from the viewpoint of moisture-proof property. Further, it is preferably at most 50 nm, particularly preferably at most 30 nm, with a view to maintaining light transmittance, maintaining flexibility of the substrate sheet and securing adhesion to the substrate sheet.

The laminate of the present invention has the above constitution, whereby it is excellent in weather resistance, moisture-proof property, adhesion between layers and its long-term stability. That is, since the adhesive layer contains a specific metal oxide as the main component, the adhesion between the adhesive layer and the moisture-proof layer, and between the adhesive layer and the substrate sheet, is high. Therefore, the adhesion and its long-term stability as the whole laminate are high. Further, since the adhesive layer has high transparency, the whole laminate is also excellent in transparency.

Therefore, the laminate of the present invention is useful as a protective sheet for a solar cell module.

For example, since the adhesion and its long-term stability as the whole laminate are high, according to the solar cell module wherein the laminate is provided so that the moisture-proof layer side is on the side of the filler layer of e.g. EVA, reduction in the adhesive strength between the substrate sheet and the filler layer hardly occurs.

Further, with respect to the laminate, since the substrate sheet, the adhesive layer and the moisture-proof layer have high transparency respectively, transparency is high as the whole laminate. Therefore, the laminate can be used as a protective sheet for protecting the side where sunlight hits in the solar cell module.

Here, in a case where the laminate of the present invention is used as a protective sheet for protecting the side where sunlight hits in the solar cell module, the visible light transmittance of the laminate is preferably at least 80%, more preferably at least 85%, further preferably at least 90%. The upper limit is not particularly limited since the higher the visible light transmittance is, the better it is. However, it is practically about 98%.

Further, the substrate sheet containing a fluororesin is excellent in weather resistance, heat resistance, chemical resistance and further stain resistance. Therefore, when the laminate is provided so that the outermost layer of the solar cell module is the substrate sheet, it is possible to prevent the performance from decreasing by stains for a long period of time, since dust or trash is unlikely to be attached to the surface of the solar cell module.

EXAMPLES

Now, the present invention will be described in further detail with reference to Examples. However, the present invention is by no means restricted thereto.

Here, measuring methods and evaluation methods used in the following Examples are as follows.
[Measurement of Visible Light Transmittance]

Spectral transmission spectrum was measured by using a spectrometer (tradename "UV-3100PC" manufactured by Shimadzu Corporation) and the visible light transmittance (%) was calculated from the measured value based on JIS R3106-1998.
[Film Thickness of Each Layer]

Film thickness was measured by using a spectral ellipsometry device (tradename "M-2000DI" manufactured by J.A. WOOLLAM JAPAN), and calculated by carrying out optical fitting by "WVASE32" (manufactured by J.A. WOOLLAM).
[Evaluation of Adhesion]

One having the laminate obtained in each of Examples and Comparative Examples cut to a size of 10 cm×10 cm and an EVA film cut to the same size ("W25CL" manufactured by Bridgestone Corporation) were laminated in the order of ETFE film/adhesive layer/moisture-proof layer/EVA film (only in Comparative Example 1, the order of ETFE film/moisture-proof layer/EVA film), followed by thermocompression bonding under conditions of pressure of 10 kgf/cm by a press machine (manufactured by Asahi Glass Company, Limited), area of 120 cm$^2$, temperature of 150° C. and time of 10 minutes to obtain a test specimen.

Then, each test specimen was cut to a size of 1 cm×10 cm, and using a TENSILON universal testing machine "RTC-1310A" manufactured by Orientec Co., Ltd., adhesive strength (peeling adhesive strength, unit: N/cm) was measured by 180° peeling test in accordance with JIS K6854-2, at a pulling rate of 50 mm/min.

The measurement of the adhesive strength was carried out before (initial stage) and after the following weathering test. However, weathering test was not carried out for one having the initial adhesive strength of less than 1 N/cm.

Weathering test: carried out for 100 hours by using a sunshine carbon arc lamp weathering test machine (Sunshine weather meter S 300 manufactured by Suga Test Instruments Co., Ltd.), in accordance with JIS-B7753.

One having adhesive strength of at least 5 N/cm after weathering test is marked with ○, and one at most that value is marked with ×. Further, one having the initial adhesive strength of less than 1 N/cm is also marked with ×.

Example 1

An ETFE film having a thickness of 100 μm (tradename "Aflex", manufactured by Asahi Glass Company, Limited)

was provided inside a sputter devise (manufactured by Tokki) to adjust vacuum to about 8×10⁻⁴ Pa, and 40 sccm of Ar gas and 10 sccm of $O_2$ gas were introduced into a chamber to adjust the pressure to be 0.3 Pa. Then, plasma was generated by applying direct-current voltage with power of 200 W. Zirconium was used as a target and a shatter was opened and closed to control forming time to form 5 nm of a zirconium oxide thin film on the ETFE film. Then, aluminum was used as a target and 50 sccm of Ar gas and 3 sccm of $O_2$ gas were introduced into a chamber, followed by discharge at 320 V of direct-current voltage. The shatter was opened and closed to control forming time, whereby 20 nm of an aluminum oxide thin film was formed and a laminate comprising ETFE film/ zirconium oxide (adhesive layer)/aluminum oxide (moisture-proof layer) was prepared.

With respect to the laminate, the measurement of a visible light transmittance (%) and the evaluation for adhesion were carried out. The results are shown in Table 1.

Example 2

A laminate comprising ETFE film/tantalum oxide (adhesive layer)/aluminum oxide (moisture-proof layer) was prepared in the same manner as in the above Example 1 except that tantalum was used as a target instead of aluminum to form 5 nm of a tantalum oxide thin film.

With respect to the laminate, the measurement of a visible light transmittance (%) and the evaluation of adhesion were carried out. The results are shown in Table 1.

Example 3

A laminate comprising ETFE film/hafnium oxide (adhesive layer)/aluminum oxide (moisture-proof layer) was prepared in the same manner as in the above Example 1 except that hafnium was used as a target instead of aluminum to form 5 nm of a hafnium oxide thin film.

With respect to the laminate, the measurement of a visible light transmittance (%) and the evaluation of adhesion were carried out. The results are shown in Table 1.

Comparative Example 1

An ETFE film having a thickness of 100 µm (tradename "Aflex", manufactured by Asahi Glass Company, Limited) was provided inside a sputter devise (manufactured by Tokki) to adjust vacuum to about 8×10⁻⁴ Pa, and 50 sccm of Ar gas and 3 sccm of $O_2$ gas were introduced into a chamber, followed by discharge at 320 V of direct-current voltage. A shatter was opened and closed to control forming time, whereby 20 nm of an aluminum oxide thin film was formed and a laminate comprising ETFE film/aluminum oxide (moisture-proof layer) was prepared.

With respect to the laminate, the measurement of a visible light transmittance (%) and the evaluation of adhesion were carried out. The results are shown in Table 1.

Since the laminate of Comparative Example 1 had a weak initial adhesive strength of 0.1 N/cm, weathering test was not conducted.

Further, after the measurement of the initial adhesive strength, the peeling interface was evaluated by a fluorescent X ray, and it was found that the ETFE film and the aluminum oxide thin film were peeled at their interface.

Comparative Example 2

A laminate comprising ETFE film/SUS oxide (adhesive layer)/aluminum oxide (moisture-proof layer) was prepared in the same manner as in the above Example 1 except that a stainless steel (SUS 304) was used instead of aluminum to form 5 nm of a SUS oxide thin film.

With respect to the laminate, the measurement of a visible light transmittance (%) and the evaluation of adhesion were carried out. The results are shown in Table 1.

Comparative Example 3

In the same manner as in the above Example 1 except that a tin-aluminum alloy (Sn:Al=50 mass %:50 mass %, hereinafter referred to as Sn-50Al) was used instead of aluminum to form 5 nm of a Sn-50Al oxide thin film, a laminate comprising ETFE film/Sn-50Al oxide (adhesive layer)/aluminum oxide (moisture-proof layer) was prepared.

With respect to the laminate, the measurement of a visible light transmittance (%) and the evaluation of adhesion were carried out. The results are shown in Table 1.

Comparative Example 4

In the same manner as in the above Example 1 except that a tin-chromium alloy (Sn:Cr=70 mass %:30 mass %, hereinafter referred to as Sn-30Cr) was used instead of aluminum to form 5 nm of a Sn-30Cr oxide thin film, a laminate comprising ETFE film/Sn-30Cr oxide (adhesive layer)/aluminum oxide (moisture-proof layer) was prepared.

With respect to the laminate, the measurement of a visible light transmittance (%) and the evaluation of adhesion were carried out. The results are shown in Table 1.

Comparative Example 5

A laminate comprising ETFE film/chromium oxide (adhesive layer)/aluminum oxide (moisture-proof layer) was prepared in the same manner as in the above Example 1 except that chromium was used instead of aluminum to form 5 nm of a chromium oxide thin film.

With respect to the laminate, the measurement of a visible light transmittance (%) and the evaluation of adhesion were carried out. The results are shown in Table 1.

Comparative Example 6

A laminate comprising ETFE film/niobium oxide (adhesive layer)/aluminum oxide (moisture-proof layer) was prepared in the same manner as in the above Example 1 except that niobium was used instead of aluminum to form 5 nm of a niobium oxide thin film.

With respect to the laminate, the measurement of a visible light transmittance (%) and the evaluation of adhesion were carried out. The results are shown in Table 1.

Since the laminate of Comparative Example 6 had a weak initial adhesive strength of 0.9 N/cm, weathering test was not conducted.

Comparative Example 7

A laminate comprising ETFE film/molybdenum oxide (adhesive layer)/aluminum oxide (moisture-proof layer) was prepared in the same manner as in the above Example 1 except that molybdenum was used instead of aluminum to form 5 nm of a molybdenum oxide thin film.

With respect to the laminate, the measurement of a visible light transmittance (%) and the evaluation of adhesion were carried out. The results are shown in Table 1.

Since the laminate of Comparative Example 7 had a weak initial adhesive strength of 0.1 N/cm, weathering test was not conducted.

Comparative Example 8

In the same manner as in the above Example 1 except that a tungsten-titanium alloy (W:Ti=90 mass %:10 mass %, hereinafter referred to as W-10Ti) was used instead of aluminum to form 5 nm of a W-10Ti oxide thin film, a laminate comprising ETFE film/W-10Ti oxide (adhesive layer)/aluminum oxide (moisture-proof layer) was prepared.

With respect to the laminate, the measurement of a visible light transmittance (%) and the evaluation of adhesion were carried out. The results are shown in Table 1.

Example 4

An ETFE film having a thickness of 100 μm (tradename "Aflex", manufactured by Asahi Glass Company, Limited) was provided inside a sputter devise (manufactured by Tokki) to adjust vacuum to about $8\times10^{-4}$ Pa, 50 sccm of Ar gas was introduced and the pressure inside the sputter devise was controlled to 2.6 Pa by a variable valve. Plasma was generated by applying 60 W of RF (radio frequency) to the substrate to carry out surface treatment for 60 seconds. Then, 40 sccm of Ar gas and 10 sccm of $O_2$ gas were introduced into a chamber to adjust the pressure to be 0.3 Pa. Then, plasma was generated by applying direct-current voltage with power of 200 W. Zirconium was used as a target and a shatter was opened and closed to control forming time to form 5 nm of a zirconium oxide thin film on the ETFE film. Then, aluminum was used as a target and 50 sccm of Ar gas and 3 sccm of $O_2$ gas were introduced into a chamber, followed by discharge at 320 V of direct-current voltage. The shatter was opened and closed to control forming time, whereby 20 nm of an aluminum oxide thin film was formed and a laminate comprising ETFE film/zirconium oxide (adhesive layer)/aluminum oxide (moisture-proof layer) was prepared.

With respect to the laminate, a visible light transmittance (%) and the adhesion strength (initial and after weathering test) were measured. The results are shown in Table 1.

Example 5

A laminate comprising ETFE film/tantalum oxide (adhesive layer)/aluminum oxide (moisture-proof layer) was prepared in the same manner as in the above Example 1 except that tantalum was used as a target instead of aluminum to form 5 nm of a tantalum oxide thin film.

With respect to the laminate, the measurement of a visible light transmittance (%) and the evaluation of adhesion were carried out. The results are shown in Table 1.

Example 6

A laminate comprising ETFE film/hafnium oxide (adhesive layer)/aluminum oxide (moisture-proof layer) was prepared in the same manner as in the above Example 1 except that hafnium was used as a target instead of aluminum to form 5 nm of a hafnium oxide thin film.

With respect to the laminate, the measurement of a visible light transmittance (%) and the evaluation of adhesion were carried out. The results are shown in Table 1.

TABLE 1

| | | | Adhesion | | |
| | | | Adhesive strength (N/cm) | | |
| | Constitution | Tv (%) | Initial | After weathering test for 100 hours | Evaluation |
| --- | --- | --- | --- | --- | --- |
| Ex. 1 | ETFE/$ZrO_2$/$Al_2O_3$ | 93.9 | 25.0 | 8.4 | ○ |
| Ex. 2 | ETFE/$Ta_2O_5$/$Al_2O_3$ | 91.9 | 28.9 | 18.5 | ○ |
| Ex. 3 | ETFE/HfO/$Al_2O_3$ | 94.5 | 25.0 | 22.0 | ○ |
| Comp. Ex. 1 | ETFE/$Al_2O_3$ | 92.3 | 0.1 | — | X |
| Comp. Ex. 2 | ETFE/SUS-oxide/$Al_2O_3$ | 81.2 | 23.1 | 1.0 | X |
| Comp. Ex. 3 | ETFE/Sn—50Al oxide/$Al_2O_3$ | 90.1 | 22.7 | 1.0 | X |
| Comp. Ex. 4 | ETFE/Sn—30Cr oxide/$Al_2O_3$ | 84.4 | 8.4 | 1.0 | X |
| Comp. Ex. 5 | ETFE/CrO/$Al_2O_3$ | 80.3 | 1.6 | 0.3 | X |
| Comp. Ex. 6 | ETFE/$Nb_2O_5$/$Al_2O_3$ | 88.6 | 0.9 | — | X |
| Comp. Ex. 7 | ETFE/MoO/$Al_2O_3$ | 84.0 | 0.1 | — | X |
| Comp. Ex. 8 | ETFE/W—10Ti oxide/$Al_2O_3$ | 86.3 | 8.8 | 0.6 | X |
| Ex. 4 | ETFE/$ZrO_2$/$Al_2O_3$ | 93.9 | 25.2 | 7.4 | ○ |
| Ex. 5 | ETFE/$Ta_2O_5$/$Al_2O_3$ | 91.9 | 27.4 | 15.3 | ○ |
| Ex. 6 | ETFE/HfO/$Al_2O_3$ | 94.5 | 27.4 | 20.2 | ○ |

As shown in the above results, as compared with the laminate in Comparative Example 1, on which an adhesive layer was not provided, the laminates in Examples 1 to 3 had the same or higher visible light transmittance (Tv) and high transparency. Further, the initial adhesive strength was improved largely, and a certain degree of adhesive strength was maintained even after weathering test. With respect to the laminates in Examples 4 to 6, which had the same constitution as the ones in Examples 1 to 3 respectively except that surface treatment was carried out for a ETFE film, almost similar results were obtained.

On the other hand, as compared with the laminate in Comparative Example 1, on which an adhesive layer was not provided, the laminates in Comparative Examples 2 to 8 had a low visible light transmittance (Tv) and decreased transparency. Further, the evaluation result for adhesion was poor, and for example, in Comparative Examples 2 and 3, the initial adhesive strength was relatively good, however, the adhesive strength after weathering test decreased largely. In Comparative Examples 4, 5 and 8, the initial adhesive strength was low as compared with Examples 1 to 6, and further, the adhesive strength after weathering test decreased drastically. In Comparative Examples 6 and 7, the initial adhesive strength was less than 1.0 N/cm.

Industrial Applicability

The laminate of the present invention is excellent in weather resistance, moisture-proof property, adhesion between layers and its long-term stability, and is useful for a protective sheet for a solar cell module.

This application is a continuation of PCT Application No. PCT/JP2011/054808, filed on Mar. 2, 2011, which is based upon and claims the benefit of priority from Japanese Patent Application No. 2010-056224 filed on Mar. 12, 2010. The contents of those applications are incorporated herein by reference in its entirety.

What is claimed is:

1. A laminate comprising a substrate sheet containing an ethylene/tetrafluoroethylene copolymer, an adhesive layer, and a moisture-proof layer containing at least 95 mol % of at least one inorganic compound selected from the group consisting of an inorganic oxide, an inorganic nitride and an inorganic oxynitride, laminated in this order, wherein the adhesive layer contains at least 95 mol % of at least one metal oxide selected from the group consisting of zirconium oxide, tantalum oxide and hafnium oxide, and wherein the thickness of the moisture-proof layer is at most 50 nm.

2. The laminate according to claim 1, wherein the moisture-proof layer contains a Si compound or an Al compound as the inorganic compound.

3. The laminate according to claim 1, wherein the moisture-proof layer contains aluminum oxide.

4. The laminate according to claim 1, which has a visible light transmittance of at least 80%.

5. A protective sheet for a solar cell module, comprising the laminate of claim 1.

6. The laminate according to claim 1, wherein the thickness of the moisture-proof layer is at most 30 nm.

7. The laminate according to claim 1, wherein the thickness of the adhesive layer is 0.5 to 20 nm.

8. The laminate according to claim 1, wherein the thickness of the substrate sheet is 10 to 200 µm.

* * * * *